US009553596B1

United States Patent
Chen et al.

(10) Patent No.: US 9,553,596 B1
(45) Date of Patent: Jan. 24, 2017

(54) FREQUENCY SYNTHESIZER AND METHOD FOR FREQUENCY SYNTHESIS

(71) Applicant: Industrial Technology Research Institute, Hsinchu (TW)

(72) Inventors: Wei-Zen Chen, Hsinchu (TW); Hsin-Pei Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/085,016

(22) Filed: Mar. 30, 2016

(30) Foreign Application Priority Data

Dec. 24, 2015 (TW) .............................. 104143529 A (51) Int. Cl.
| | | |
|---|---|---|
| *H04B 1/40* | (2015.01) | |
| *H03L 7/23* | (2006.01) | |
| *H03L 7/197* | (2006.01) | |
| *H03L 7/093* | (2006.01) | |
| *H03L 7/099* | (2006.01) | |
| *H03L 7/089* | (2006.01) | |

(52) U.S. Cl.
CPC .............. *H03L 7/23* (2013.01); *H03L 7/0891* (2013.01); *H03L 7/093* (2013.01); *H03L 7/099* (2013.01); *H03L 7/1974* (2013.01); *H04B 1/40* (2013.01)

(58) Field of Classification Search
CPC .......... H03L 7/23; H03L 7/0891; H03L 7/093; H03L 7/099; H03L 7/1974; H03L 7/22; H04B 1/40
See application file for complete search history.

(56) References Cited

U.S. PATENT DOCUMENTS

| | | | | |
|---|---|---|---|---|
| 5,579,184 A | * | 11/1996 | Nakanishi | ............... H03L 7/089 327/156 |
| 6,005,443 A | | 12/1999 | Damgaard et al. | |
| 6,115,586 A | | 9/2000 | Bezzam et al. | |

(Continued)

FOREIGN PATENT DOCUMENTS

| | | |
|---|---|---|
| CN | 102468849 A | 5/2012 |
| TW | I341090 B | 5/2007 |

(Continued)

OTHER PUBLICATIONS

Razavi, B., "Cognitive Radio Design Challenges and Techniques," IEEE Journal of Solid-State Circuits, Aug. 2010, 1542-1553, US.

(Continued)

*Primary Examiner* — Nguyen Vo (74) *Attorney, Agent, or Firm* — Mintz Levin Cohn Ferris Glovsky and Popeo, P.C.; Peter F. Corless; Steven M. Jensen (57) ABSTRACT

A frequency synthesizer and a method for frequency synthesis are provided. The frequency synthesizer includes a subband phase-locked loop (PLL) and a main PLL. A divisor of an adjustable non-integer frequency divider in the subband PLL is adjusted, and a channel frequency of a maximum frequency band of all frequency bands is output. A divisor of an adjustable integer frequency divider in the main PLL is adjusted, and a center frequency required for each frequency band of the all frequency bands is output. The center frequency and the channel frequency are mixed by a mixer to produce a band frequency. A quantization noise generated by the adjustable non-integer frequency divider is filtered out by the subband PLL to reduce the impact of the quantization noise on the main PLL.

19 Claims, 6 Drawing Sheets

(56) References Cited

U.S. PATENT DOCUMENTS

| | | | |
|---|---|---|---|
| 6,828,863 | B2 | 12/2004 | Itkin et al. |
| 6,931,243 | B2 | 8/2005 | Goldman |
| 7,298,218 | B2 | 11/2007 | Ghazali et al. |
| 7,424,280 | B2 | 9/2008 | Yu |
| 7,560,960 | B2 | 7/2009 | Park et al. |
| 7,589,597 | B2 | 9/2009 | Chang et al. |
| 7,715,802 | B2 | 5/2010 | Yoshida et al. |
| 7,928,807 | B2 | 4/2011 | Mishra |
| 9,112,517 | B1 * | 8/2015 | Lye .................... H03L 7/087 |
| 2006/0197613 | A1 * | 9/2006 | Bunch ................ H03C 3/0966 331/16 |
| 2008/0285625 | A1 | 11/2008 | Chang et al. |
| 2010/0073052 | A1 | 3/2010 | Choi et al. |

FOREIGN PATENT DOCUMENTS

| | | |
|---|---|---|
| TW | I339952 B | 6/2007 |
| TW | 200803180 A | 1/2008 |
| TW | I316793 B | 11/2009 |
| TW | 201225544 A | 6/2012 |

OTHER PUBLICATIONS

Lee, J., "A 3-to-8 GHz Fast-hopping frequency synthesizer in 0.18-mm CMOS Technology," IEEE Journal of Solid-State Circuits, Mar. 2008, 566-573, US.

Tak, G., et al., "A 6.3-9-GHz CMOS Fast Settling PLL for MB-OFDM UWB Applications," IEEE Journal of Solid-State circuits, vol. 40, No. 8, Aug. 2005, pp. 1671-1679, US.

Ismail, A. et al., "A 3.1-to 8.2-GHz Zero-IF Received and Direct Frequency Synthesizer in 0.18-mm SiGe BiCMOS for Mode-2 MB-OFDM UWB Communication," IEEE Journal of Solid-State Circuits, vol. 40, No. 12, Dec. 2005, pp. 2573-2582, US.

Jian, J. et al., "A Fractional-N PLL for Multiband (0.8-6 GHz) Communications Using Binary-Weighted D/A Dirrerentiator and Offset Frequency D-S Modulator," IEEE Journal of Solid-State Circuits, vol. 45, No. 4, Apr. 2010, pp. 768-780, US.

Mishra, C., et al., "System and Circuit Design for an MB-OFDM UWB Frequency Synthesizer," IEE Transactions on Circuits and Systems—I: Regular Papers, vol. 56, No. 7, pp. 1467-1477, Jul. 2009, US.

Zheng, H. et al., "A 1.5 V 3.1 GHz-8 Ghz CMOS Synthesizer for 9-Band MB-OFDM UWB Transceivers," IEEE Journal of Solid-State Circuits, vol. 42, No. 6, Jun. 2007, pp. 1250-1260, US.

Peng, K., et al., "Enhancement of Frequency Synthesizer Operating Range Using a Novel Frequency-Offset Technique for LTE-A and CR Applications," IEEE Transactions on Microwave Theory and Techniques, vol. 61, No. 3, Mar. 2013, pp. 1215-1223, US.

Rogers, J. et al, "A Multiband DS Fractional-N Frequency Synthesizer for a MIMO WLAN Transceiver RFIC," IEEE Journal of Solid-State Circuits, vol. 40, No. 3, Mar. 2005, pp. 678-689, US.

Nuzzo, P. et al., "A 0.1-5 GHz Dual-VCO Software-Defined SD Frequency Synthesizer in 45 nm Digital CMOS," IEEE Radio Frequency Integrated Circuits Symposium, 2009, pp. 321-324, US.

Cisco White Paper, "Cisco Visual Networking INdex: Global Mobile Data Traffic Forecast Update," 2015-2020, Feb. 3, 2016, pp. 1-39, Cisco Systems, Inc., San Jose, CA, US.

"Global LTE Subscribers Set to More than Double in 2013 and Exceed 100 Million, IHS Technology Research by Market," https://technology.ihs.com/419630/global-lte-subscribers-set-t   .   .   .   , Accessed Aug. 4, 2016.

"3rd Generation Partnership Project (3GPPP) Technical Specification; Technical Specification Group Radio Access Network; Evolved Universal Terrestrial Radio Access (E-UTRA); Base Station (BS) transmission and reception" (Release 11), eGPP TS 36.104 v11.4.0, Mar. 2013, pp. 1-134, Valbonne, FR.

* cited by examiner

FREQUENCY SYNTHESIZER AND METHOD FOR FREQUENCY SYNTHESIS

CROSS-REFERENCE TO RELATED APPLICATION

The present application is based on, and claims priority from Taiwan Application Number 104143529, filed Dec. 24, 2015, the disclosure of which is hereby incorporated by reference herein in its entirety.

BACKGROUND

1. Technical Field

This disclosure relates to frequency synthesis techniques, and also to a frequency synthesizer with two phase-locked loops and a method for frequency synthesis.

2. Description of Related Art

Due to the advances in wireless communication technologies, portable communication devices are widely used, and the mobile broadband market has been steadily growing. In response to the needs of greater amount of data transmission, mobile communication of new generation focuses on enhancing the transmission speed and bandwidth.

In recent years, 3rd Generation Partnership Project (3GPP) is committed to the development of technology in line with the 4G communication protocols, and has proposed Long-term Evolution-Advanced (LTE-A) Release 10 (R10), which is the first 4G standard recognized by the International Telecommunication Union (ITU). Data transfer rate under high-speed moving environment could reach up to 100 (Mb/s). In LTE-A technology, carrier aggregation is a key technology, which essentially aggregates non-contiguous bands for use at the same time to obtain a greater transmission bandwidth, and enhances the efficient use of bandwidth. For the purpose of carrier aggregation, a transceiver (RF transceiver) in a wireless communication device has to dynamically change the carrier frequency. A wide carrier frequency range means that a frequency synthesizer providing the local frequency must have outputs with very broad bandwidth, but this makes the oscillator design difficult. The complicated bandwidth conditions also pose challenges to the control and frequency resolution of the frequency synthesizer.

Therefore, there is a need in this field for a frequency synthesizer technology that is not only capable of obtaining the target frequency, but also provides I-Q phases in order to comply with the specifications of the frequency output range, while taking into account frequency resolution.

SUMMARY

The disclosure provides a frequency synthesizer, which may include a subband phase-locked loop (PLL) and a main PLL. The subband PLL includes an adjustable non-integer frequency divider. The subband PLL outputs a channel frequency of a maximum frequency band of all frequency bands by adjusting a divisor of the adjustable non-integer frequency divider. The main PLL includes an adjustable integer frequency divider and a mixer for outputting a center frequency required for each frequency band of the all frequency bands by adjusting a divisor of the adjustable integer frequency divider. The mixer is connected with an output end of the main PLL and an output end of the subband PLL, and mixes the center frequency and the channel frequency to produce a band frequency. The quantization noise generated by the adjustable non-integer frequency divider could be filtered out by the subband PLL, such that the impact of the quantization noise on the main PLL is reduced.

The disclosure further provides a wireless transceiver comprising the above-mentioned frequency synthesizer.

The disclosure further provides a method for frequency synthesis, which may include: providing a frequency synthesizer including a main phase-locked loop (PLL) and a subband PLL; allowing the subband PLL to output a channel frequency of a maximum frequency band of all frequency bands by adjusting a divisor of an adjustable non-integer frequency divider of the subband PLL, and allowing the main PLL to output a center frequency required for each frequency band of the all frequency bands by adjusting a divisor of an adjustable integer frequency divider of the main PLL; and allowing a mixer of the main PLL to mix the channel frequency and the center frequency to produce a band frequency.

The frequency synthesizer and the frequency synthesis method provided by the disclosure employ two phase-locked loops, wherein the main PLL achieves broadband output through the broadband oscillator, and the subband PLL achieves high resolution requirement through the delta-sigma modulator. The center frequency of the main PLL and the channel frequency of the subband PLL are mixed by the mixer to produce the band frequency outputted by the main PLL. This band frequency is then passed through the multiplexer to produce a frequency in the appropriate frequency output range. Moreover, with the two-loop mechanism proposed by the disclosure, the quantization noise could be reduced significantly.

BRIEF DESCRIPTION OF THE DRAWINGS

The disclosure could be more fully understood by reading the following detailed description of the preferred embodiments, with reference made to the accompanying drawings, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
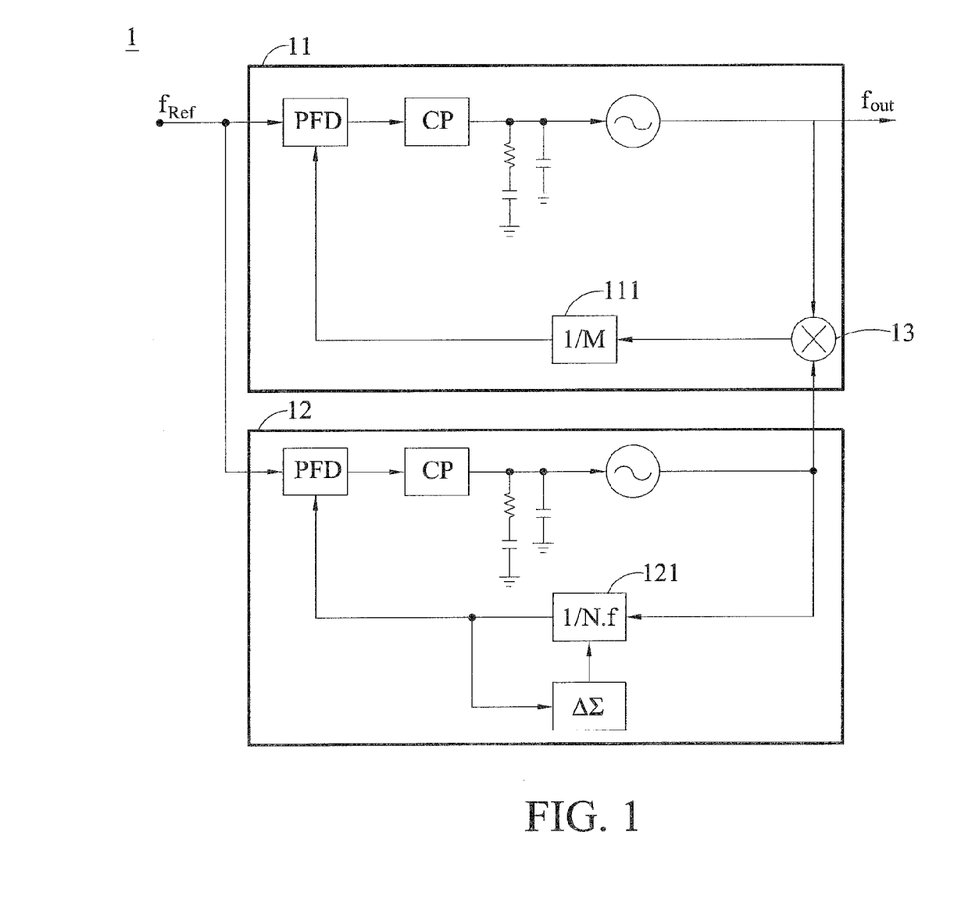
FIG. 1 is a schematic diagram depicting a frequency synthesizer in accordance with the disclosure.

Referring to FIG. 1, a schematic diagram depicting a frequency synthesizer 1 in accordance with the disclosure is shown. The frequency synthesizer 1 in accordance with the disclosure employs a two phase-locked loop (PLL) framework, and includes a main PLL 11 and a subband PLL 12.

The main PLL 11 includes an adjustable integer frequency divider 111. The adjustable integer frequency divider 111 may perform integer division, and is thus represented by 1/M. The divisor of the adjustable integer frequency divider 111 could be adjusted such that a center frequency required by each frequency band of all frequency bands is outputted by the main PLL 11.

The subband PLL 12 includes an adjustable non-integer frequency divider 121. The adjustable non-integer frequency divider 121 may perform non-integer division, and is thus represented by 1/N·f. The divisor of the adjustable non-integer frequency divider 121 could be adjusted such that a channel frequency of the maximum frequency band of all frequency bands is outputted by the subband PLL 12.

A mixer 13 is provided in the main PLL 11. The mixer 13 connects to the output end of the main PLL 11 and the output end of the subband PLL 12, and mixes the center frequency and the channel frequency to produce a band frequency, which is filtered to produce an output frequency $f_{out}$.

In the loop of the whole frequency synthesizer 1, the output frequencies of the main PLL 11 and the subband PLL 12 are mixed together and downconverted. The mixed frequency is then provided to the main PLL 11 for phase frequency comparison. Then, a signal with a specific frequency is produced, such as the aforementioned band frequency.

In addition, the effect of the quantization noise produced by the adjustable non-integer frequency divider 121 on the main PLL 11 is reduced after being filtered out by the subband PLL 12. This will be further described later.

It could be understood from the above that the frequency synthesizer 1 is made up of two phase-locked loops, i.e., the main PLL 11 and the subband PLL 12. The main PLL 11 is an integer phased-locked loop, and is to provide a plurality of center frequencies for individual frequency bands. The subband PLL 12 is a non-integer phased-locked loop, and is to output a channel frequency for all of the frequency bands, the frequency range being determined by the broadest frequency band. By mixing the center frequencies with the channel frequency using the mixer 13, output frequencies (i.e., band frequencies) could be produced from the main PLL 11. As such, the frequency synthesizer 1 is capable of producing frequencies in the appropriate frequency output range.

Figure 2A:
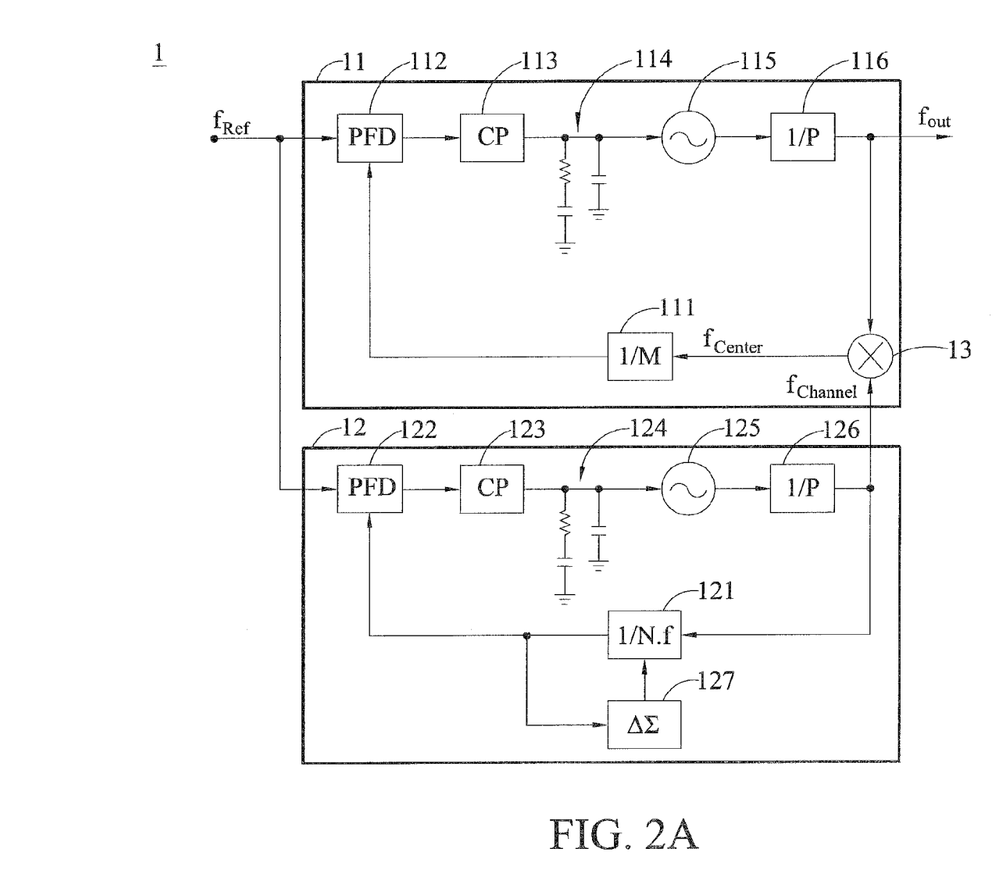
FIG. 2A is a schematic diagram illustrating a first embodiment of the frequency synthesizer in accordance with the disclosure.

Referring to FIG. 2A, a schematic diagram illustrating a first embodiment of the frequency synthesizer in accordance with the disclosure is shown. The inner structures of the main PLL 11 and the subband PLL 12 of the frequency synthesizer 1 are further illustrated. The main PLL 11 is used for outputting a plurality of center frequencies $f_{Center}$ to individual frequency bands (though only one is produced at a time). The main PLL 11 includes a first phase frequency detector (PFD) 112, a first charge pump (CP) 113, a first loop filter 114, and a first voltage controlled oscillator (VCO) 115.

The first PFD 112 is used for comparing a phase difference between a reference signal $f_{Ref}$ inputted externally and a band frequency of the main PLL 11 after frequency division by the adjustable integer frequency divider 111, and producing a proportional voltage output, that is, a first output voltage, for controlling the charging/discharging the first loop filter 114 by the first CP 113.

The first CP 113 is coupled with the first PFD 112, and is used for producing a first charging/discharging current based on the first output voltage from the first PFD 112. The first charging/discharging current is used for charging/discharging the first loop filter 114.

The first loop filter 114 is coupled with the first CP 113, and is used for producing a first control voltage according to the first charging/discharging current. In an embodiment, the first loop filter 114 is capable of filtering out the high frequency components to form a DC voltage value, which is used as a control voltage for the first VCO 115, thereby controlling the output signal frequency of the first VCO 115.

The first VCO 115 is coupled with the first loop filter 114, and is used for adjusting its output signal frequency (that is, a center frequency $f_{Center}$ produced by the main PLL 11) according to the first control voltage produced by the first loop filter 114. In an embodiment, the first VCO 115 is an inductance-capacitance type VCO (LC-VCO).

Moreover, depending on the requirements, a first loop frequency divider 116 could be provided between the first VCO 115 and the mixer 13 in the main PLL 11. The first loop frequency divider 116 is used for performing frequency division on the center frequency $f_{Center}$ outputted by the first VCO 115. The divisor of the first loop frequency divider 116 could be adjusted as needed, and is thus represented as 1/P in the diagram. P is an integer.

The subband PLL 12 is used for outputting a channel frequency $f_{Channel}$ to be used by all of the frequency bands. The subband PLL 12 further includes a second phase frequency detector (PFD) 122, a second charge pump (CP) 123, a second loop filter 124, and a second voltage controlled oscillator (VCO) 125.

The second PFD 122 is used for comparing a phase difference between a reference signal $f_{Ref}$ inputted externally and the channel frequency $f_{Channel}$ of the subband PLL 12 after frequency division by the adjustable non-integer frequency divider 121, and producing a proportional voltage output, that is, a second output voltage, for controlling the charging/discharging the second loop filter 124 by the second CP 123.

The second CP 123 is coupled with the second PFD 122, and is used for producing a second charging/discharging current based on the second output voltage from the second PFD 122. The second charging/discharging current is used for charging/discharging the second loop filter 124.

The second loop filter 124 is coupled with the second CP 123, and is used for producing a second control voltage according to the second charging/discharging current. More specifically, the second loop filter 124 is capable of filtering out the high frequency components to form a DC voltage value, which is used as a control voltage for the second VCO 125, thereby controlling the output signal frequency of the second VCO 125.

The second VCO 125 is coupled with the second loop filter 124, and is used for adjusting its output signal frequency (that is, the channel frequency $f_{Channel}$ produced by the subband PLL 12) according to the second control voltage produced by the second loop filter 124.

Moreover, depending on the requirements, a second loop frequency divider 126 could be provided between the second VCO 125 and the mixer 13 in the subband PLL 12. The second loop frequency divider 126 is used for performing frequency division on the channel frequency $f_{Channel}$ produced by the second VCO 125. This frequency division reduces the impact of the quantization noise of the subband PLL 12 on the main PLL 11.

In an embodiment, the main PLL 11 uses a broadband oscillator to achieve broadband outputs, whereas the subband PLL 12 is a non-integer phase-locked loop, and uses a delta-sigma modulator 127 to achieve high resolution. The delta-sigma modulator 127 is shown as ΔΣ in the diagram. However, a trade-off between oscillator noise and quantization noise (produced by the delta-sigma modulator 127) has to be made when selecting the frequency bandwidth. In other words, if a smaller bandwidth is chosen, the quantization noise could be suppressed more effectively; on the contrary, if a larger bandwidth is chosen, the oscillator noise could be suppressed effectively.

Ideally, a larger bandwidth is selected for the main PLL 11, but the impact of the quantization noise of the subband PLL 12 should be minimized Therefore, in the frequency synthesizer 1 according to the disclosure, since the adjustable non-integer frequency divider 121 is provided in the subband PLL 12, the quantization noise produced by the delta-sigma modulator 127 of the subband PLL 12 is filtered out before being outputted. That is, the quantization noise is filtered out by the second loop frequency divider 126 to remove unwanted noise. Thus, when the mixed result is delivered to the main PLL 11 by the mixer 13, the impact of the quantization noise on the main PLL 11 is significantly reduced.

Therefore, by providing the adjustable non-integer frequency divider 121 in the subband PLL 12, a good loop bandwidth could be designed to significantly reduce the contribution of the quantization noise on the output.

Figure 2B:
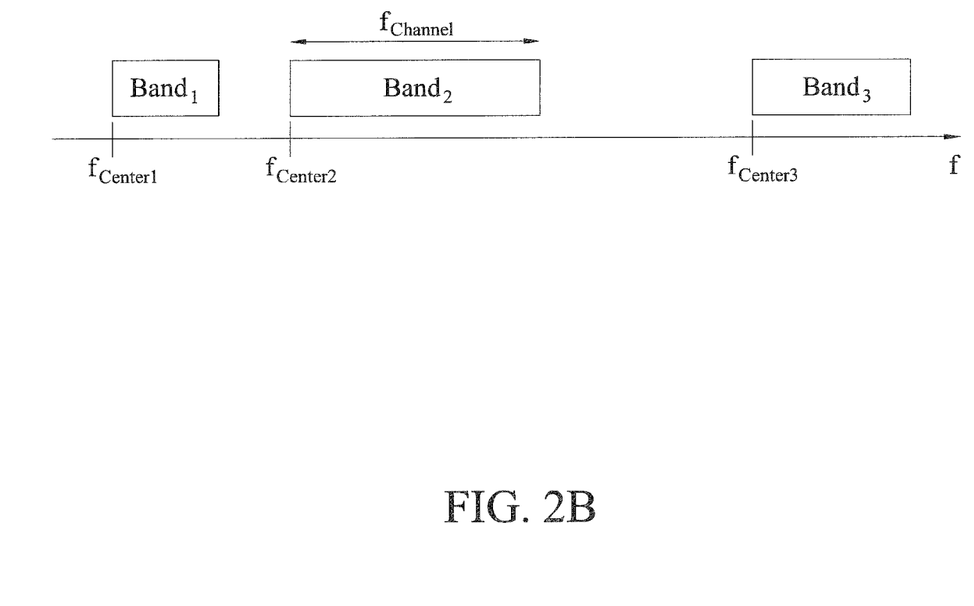
FIG. 2B is a schematic diagram illustrating various band frequencies produced by the frequency synthesizer in accordance with the disclosure.

Referring to FIG. 2B, a schematic diagram illustrating various band frequencies produced by the frequency synthesizer in accordance with the disclosure is shown. As mentioned earlier, the main PLL is used for outputting a plurality of center frequencies $f_{Center}$ for individual frequency bands, while the subband PLL is used for outputting one channel frequency $f_{Channel}$ for used by all of the frequency bands. Thus, after mixing by the mixer 13, required frequencies could be produced.

As shown, the frequency synthesizer is required to output frequencies of $Band_1$, $Band_2$, and $Band_3$. Thus, the main PLL may generate three center frequencies $f_{Center}$, namely $f_{Center1}$, $f_{Center2}$, and $f_{Center3}$. The subband PLL produces a channel frequency $f_{Channel}$. Upon mixing the center frequencies and the channel frequency, the required frequencies of $Band_1$, $Band_2$, and $Band_3$ are produced, thereby achieving the goal of generating required frequency outputs in accordance with the disclosure.

Figure 3:
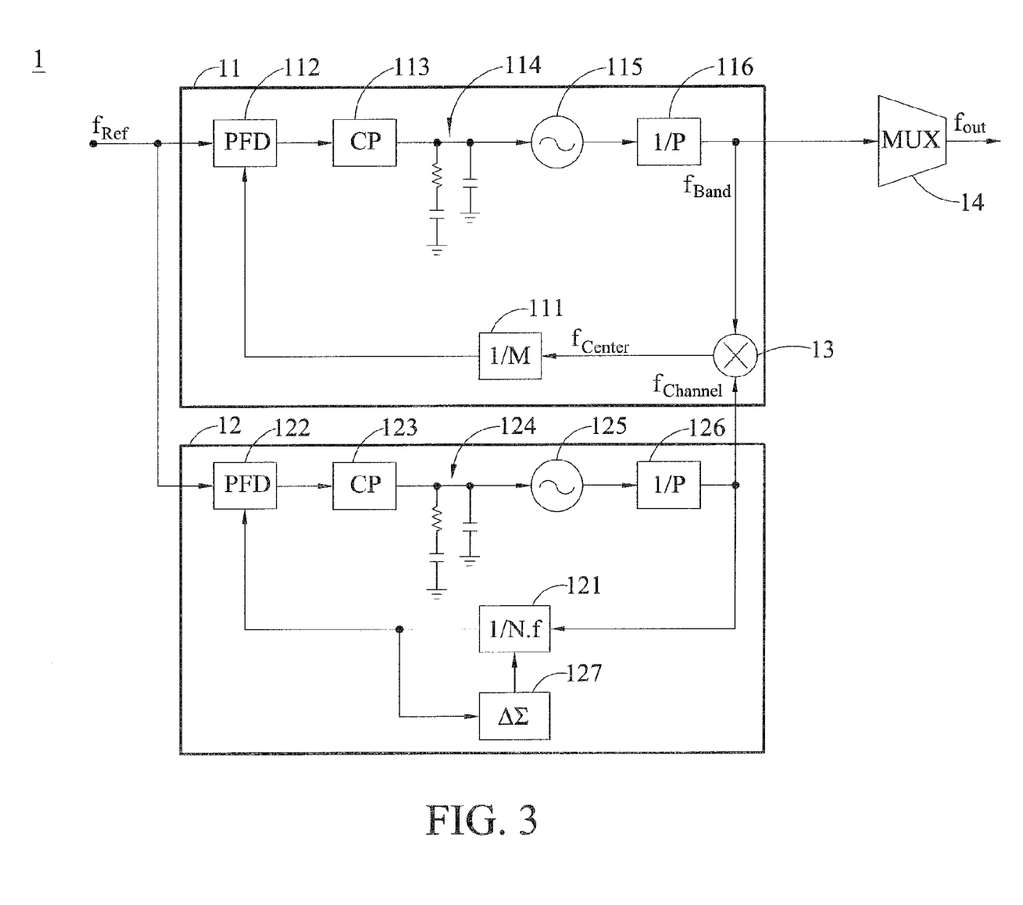
FIG. 3 is a schematic diagram illustrating a second embodiment of the frequency synthesizer in accordance with the disclosure.

Referring to FIG. 3, a schematic diagram illustrating a second embodiment of the frequency synthesizer in accordance with the disclosure is shown. As shown, in the frequency synthesizer 1 of the second embodiment the first PFD 112, the first CP 113, the first loop filter 114, the first VCO 115 and the first loop frequency divider 116 in the main PLL 11, and the second PFD 122, the second CP 123, the second loop filter 124, the second VCO 125 and the second loop frequency divider 126 in the subband PLL 12 are the same to those described with respect to FIG. 2A, further description thereof hereby omitted. In an embodiment, the frequency synthesizer 1 further includes a multiplexer 14.

The multiplexer 14 is connected to the output end of the main PLL 11 for determining whether to maintain or divide the band frequency outputted by the main PLL 11. In an embodiment, the multiplexer 14 could be used for selecting a multiple for the output, for example, a multiple of 1, ½, ¼ etc. In other words, a multiple for the band frequency outputted by the main PLL 11 could be selected via the multiplexer 14. In an embodiment, the first loop frequency divider 116 and the second loop frequency divider 126 could be added or removed, depending on the needs.

Figure 4:
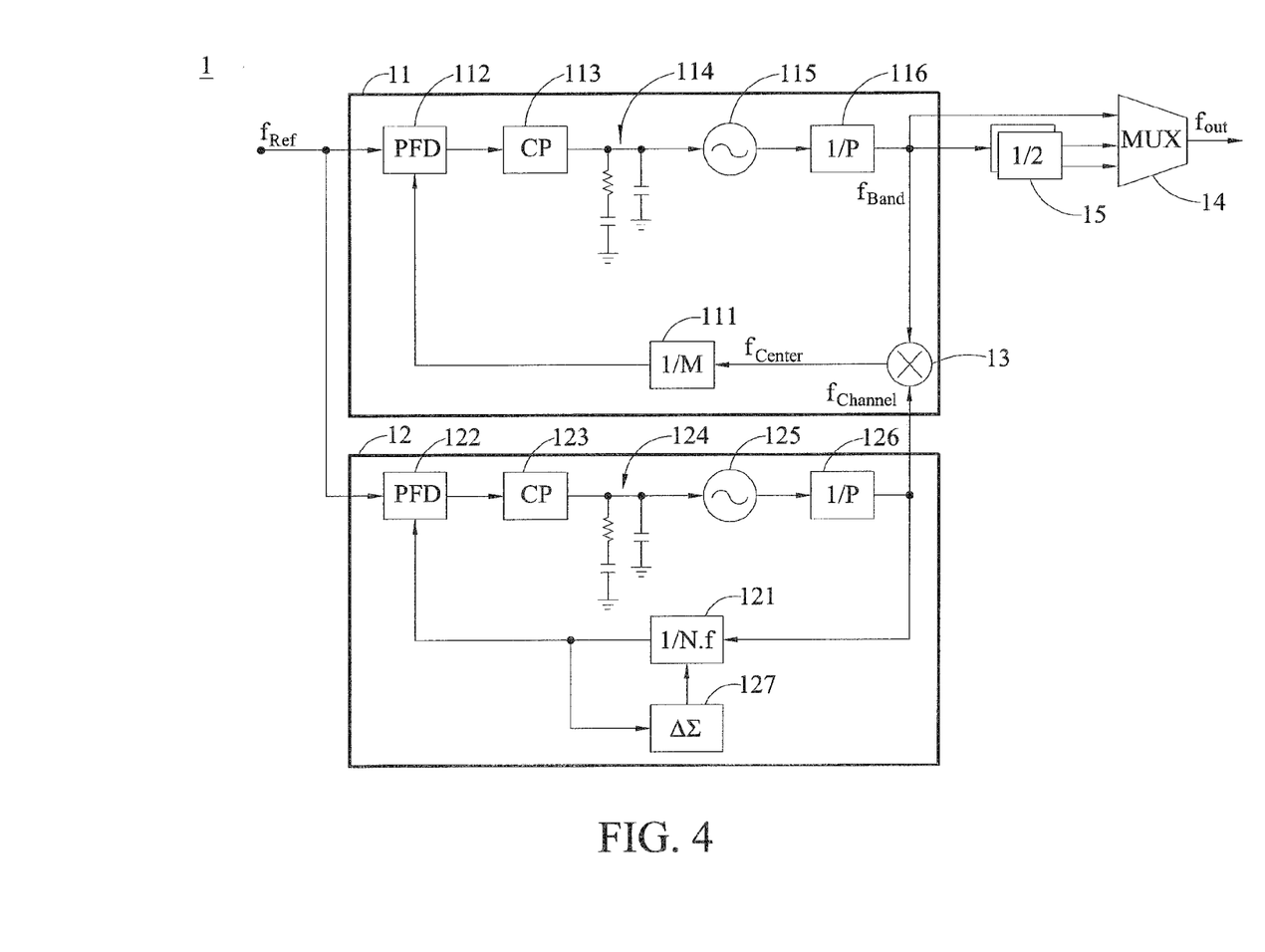
FIG. 4 is a schematic diagram illustrating a third embodiment of the frequency synthesizer in accordance with the disclosure.

Referring to FIG. 4, a schematic diagram illustrating a third embodiment of the frequency synthesizer in accordance with the disclosure is shown. As shown, in the frequency synthesizer 1 of the third embodiment the various components in the main PLL 11 and the subband PLL 12 are the same as those described with respect to FIG. 3, further description thereof hereby omitted. In an embodiment, the frequency synthesizer 1 further includes a halving circuit 15.

The halving circuit 15 is provided between the multiplexer 14 and the output end of the main PLL 11. The halving circuit 15 could have a cascading design. The halving circuit 15 is used as the output of the frequency synthesizer 1 in order to meet the requirement for frequency outputs as well as the requirement that the outputs need to have I-Q phases. In an embodiment, since the outputs of the halving circuit 15 are signals with quadrature phases, there is no need for a Quad-VCO to achieve outputs with quadrature phases. Similarly, in this embodiment, the first loop frequency divider 116 and the second loop frequency divider 126 could be added or removed depending on the needs.

In addition, the frequency synthesizer according to the disclosure could be incorporated into a wireless transceiver, so as to provide the required frequency when the wireless transceiver is producing an output frequency. In other words, the wireless transceiver includes a frequency synthesizer with a design of two phase-locked loops, that is, a main PLL and a subband PLL, and the arrangement and operations of the various components of the main PLL and the subband PLL are the same as those described with respect to FIGS. 1 to 4.

Figure 5:
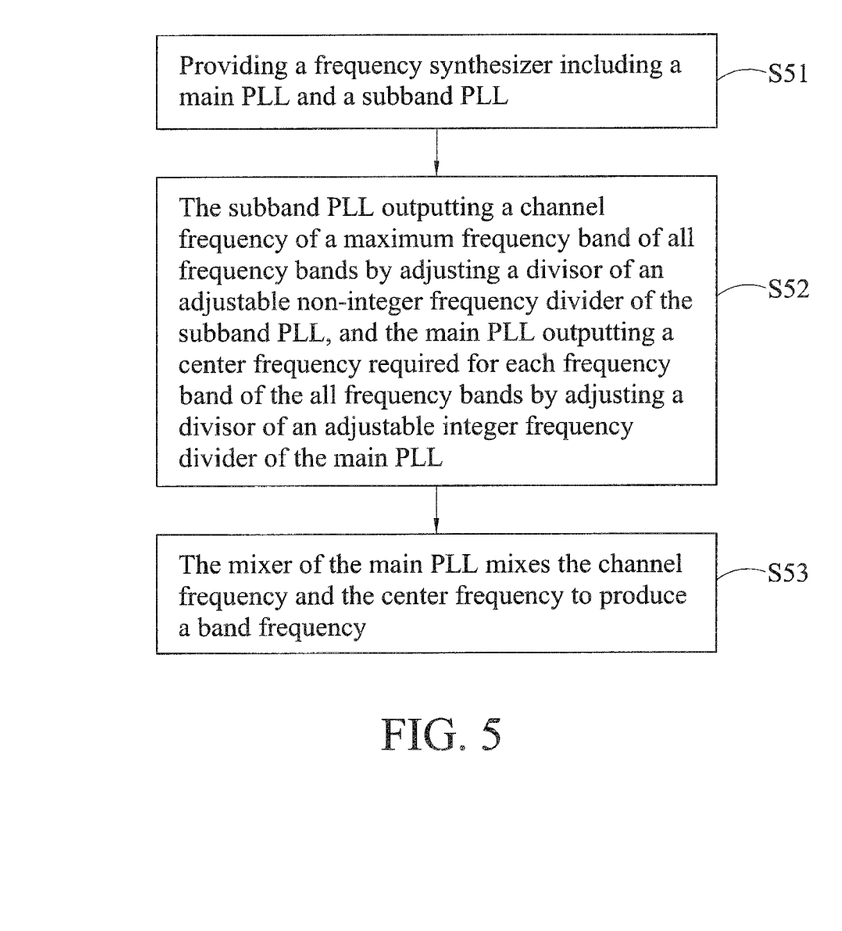
FIG. 5 is a flowchart illustrating a frequency synthesis method in accordance with the disclosure.

Referring to FIG. 5, a flowchart illustrating a frequency synthesis method in accordance with the disclosure is shown. In an embodiment, the frequency synthesis method in accordance with the disclosure outputs appropriate band frequencies through two phase-locked loops. In the frequency synthesis method in accordance with the disclosure, a frequency with a larger bandwidth could be produced without the impact of quantization noise.

In step S51, a frequency synthesizer including a main phase-locked loop (PLL) and a subband PLL is provided. In an embodiment, the frequency synthesizer is two phase-locked loops, namely, a main PLL and a subband PLL. The main PLL and the subband PLL could produce required frequencies through mixing.

In step S52, by adjusting the divisor of an adjustable non-integer frequency divider of the subband PLL, a channel frequency of the maximum frequency band of all the frequency bands is outputted by the subband PLL; and by adjusting the divisor of an adjustable integer frequency divider of the main PLL, a center frequency for each frequency band of all the frequency bands is outputted by the main PLL. In an embodiment, the subband PLL is used for outputting a channel frequency to be used by all of the frequency bands, so by adjusting the divisor of the adjustable non-integer frequency divider of the subband PLL, a channel frequency of the maximum frequency band of all the frequency bands could be outputted by the subband PLL.

In addition, the main PLL is used for outputting a plurality of center frequencies for individual frequency bands, so by adjusting the divisor of the adjustable integer frequency divider of the main PLL, a center frequency for individual frequency band could be outputted by the main PLL.

In step S53, the channel frequency and the center frequency are mixed by a mixer in the main PLL to produce a band frequency. In an embodiment, the main PLL outputs a center frequency used for individual frequency band, and the subband PLL outputs a channel frequency of a maximum frequency band of all of the frequency bands. The mixer connects to the output end of the main PLL and the output end of the subband PLL. Through mixing, a band frequency is generated, which is then filtered by the main PLL before outputting by the frequency synthesizer.

Moreover, the frequency synthesis method according to the disclosure further includes filtering out the quantization noise produced by the adjustable non-integer frequency divider by the subband PLL to reduce the impact of the quantization noise on the main PLL. The traditional design employs a single loop, which makes the effect of the quantization noise more noticeable as it lacks a low-pass response. On the contrary, the disclosure employs two loops. As a result, the quantization noise produced by the adjustable non-integer frequency divider of the subband PLL will not impact the VCO in the main PLL, that is, the subband PLL is able to filter out the quantization noise produced by the adjustable non-integer frequency divider. More specifically, the VCO in the subband PLL performs filtering on the signal, that is, forms some kind of low-power response before transmitting it to the mixer, thus reducing the effect of the quantization noise on the VCO in the main PLL. As a result, the VCO in the main PLL may choose a larger bandwidth, avoiding compromise between the two.

The frequency synthesis method according to the disclosure further includes passing the band frequency through a multiplexer connected to the output end of the main PLL in order to maintain or divide the band frequency. In other words, before being outputted, the multiplexer is used to maintain the band frequency or perform frequency division on the band frequency.

The frequency synthesis method according to the disclosure further includes, before passing through the multiplexer, passing the band frequency through a cascaded halving circuit provided between the output end of the main PLL and the multiplexer. By passing through different divider stages, a frequency within a required output range is outputted.

In summary, the frequency synthesizer and the frequency synthesis method proposed by the disclosure employ two phase-locked loops, wherein the main PLL achieves broadband output through the broadband oscillator, and the subband PLL achieves high resolution requirement through the delta-sigma modulator. Since the subband PLL is capable of filtering out the quantization noise produced by its adjustable non-integer frequency divider, after mixing the center frequency of the main PLL and the channel frequency of the subband PLL by the mixer, the quantization noise will not affect the band frequency outputted by the main PLL. Thereafter, a frequency in the appropriate frequency output range is produced via the multiplexer or the halving circuit. Therefore, with the two loops mechanism proposed by the disclosure, not only could the required frequency be outputted, a wider frequency band could also be selected without being affected by the quantization noise.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:
1. A frequency synthesizer, comprising:
   a subband phase-locked loop (PLL) including an adjustable non-integer frequency divider, the subband PLL outputting a channel frequency of a maximum frequency band of all frequency bands by adjusting a divisor of the adjustable non-integer frequency divider; and
   a main PLL including an adjustable integer frequency divider and a mixer connected with an output end of the main PLL and an output end of the subband PLL, the main PLL outputting a center frequency required for each frequency band of the all frequency bands by adjusting a divisor of the adjustable integer frequency divider, the mixer mixing the center frequency and the channel frequency to produce a band frequency,
   wherein a quantization noise generated by the adjustable non-integer frequency divider is filtered out by the subband PLL to reduce an impact of the quantization noise on the main PLL.

2. The frequency synthesizer of claim 1, wherein the main PLL further includes:
   a first phase frequency detector (PFD) configured to compare a phase difference between a reference signal inputted externally and the band frequency after frequency division performed by the adjustable integer frequency divider to produce a first output voltage;
   a first charge pump (CP) coupled with the first PFD to produce a first charging/discharging current based on the first output voltage;
   a first loop filter coupled with the first CP to produce a first control voltage according to the first charging/discharging current; and
   a first voltage controlled oscillator (VCO) coupled with the first loop filter to produce the center frequency according to the first control voltage.

3. The frequency synthesizer of claim 2, wherein the main PLL further includes a first loop frequency divider provided between the first VCO and the mixer to perform frequency division on the center frequency outputted by the first VCO.

4. The frequency synthesizer of claim 1, wherein the subband PLL further includes:
   a second phase frequency detector (PFD) configured to compare a phase difference between a reference signal inputted externally and the channel frequency after frequency division performed by the adjustable non-integer frequency divider to produce a second output voltage;
   a second charge pump (CP) coupled with the second PFD to produce a second charging/discharging current based on the second output voltage;
   a second loop filter coupled with the second CP to produce a second control voltage according to the second charging/discharging current; and
   a second voltage controlled oscillator (VCO) coupled with the second loop filter to produce the channel frequency according to the second control voltage.

5. The frequency synthesizer of claim 4, wherein the subband PLL further includes a second loop frequency divider provided between the second VCO and the mixer to perform frequency division on the channel frequency outputted by the second VCO.

6. The frequency synthesizer of claim 1, further comprising a multiplexer connected to the output end of the main PLL to determine whether to maintain or frequency divide the band frequency.

7. The frequency synthesizer of claim 6, further comprising a halving circuit cascaded between the multiplexer and the output end of the main PLL.

8. A wireless transceiver comprising the frequency synthesizer of claim 1.

9. The wireless transceiver of claim 8, wherein the main PLL of the frequency synthesizer further includes:
- a first phase frequency detector (PFD) configured to compare a phase difference between a reference signal inputted externally and the band frequency after frequency division performed by the adjustable integer frequency divider to produce a first output voltage;
- a first charge pump (CP) coupled with the first PFD to produce a first charging/discharging current based on the first output voltage;
- a first loop filter coupled with the first CP to produce a first control voltage according to the first charging/discharging current; and
- a first voltage controlled oscillator (VCO) coupled with the first loop filter to produce the center frequency according to the first control voltage.

10. The wireless transceiver of claim 9, wherein the main PLL further includes a first loop frequency divider provided between the first VCO and the mixer to perform frequency division on the center frequency outputted by the first VCO.

11. The wireless transceiver of claim 8, wherein the subband PLL of the frequency synthesizer further includes:
- a second phase frequency detector (PFD) configured to compare a phase difference between a reference signal inputted externally and the channel frequency after frequency division performed by the adjustable non-integer frequency divider to produce a second output voltage;
- a second charge pump (CP) coupled with the second PFD to produce a second charging/discharging current based on the second output voltage;
- a second loop filter coupled with the second CP to produce a second control voltage according to the second charging/discharging current; and
- a second voltage controlled oscillator (VCO) coupled with the second loop filter to produce the channel frequency according to the second control voltage.

12. The wireless transceiver of claim 11, wherein the subband PLL further includes a second loop frequency divider provided between the second VCO and the mixer to perform frequency division on the channel frequency outputted by the second VCO.

13. The wireless transceiver of claim 8, further comprising a multiplexer connected to the output end of the main PLL to determine whether to maintain or frequency divide the band frequency.

14. The wireless transceiver of claim 13, further comprising a halving circuit cascaded between the multiplexer and the output end of the main PLL.

15. A method for frequency synthesis, comprising:
- providing a frequency synthesizer including a main phase-locked loop (PLL) and a subband PLL;
- allowing the subband PLL to output a channel frequency of a maximum frequency band of all frequency bands by adjusting a divisor of an adjustable non-integer frequency divider of the subband PLL, and allowing the main PLL to output a center frequency required for each frequency band of the all frequency bands by adjusting a divisor of an adjustable integer frequency divider of the main PLL; and
- allowing a mixer of the main PLL to mix the channel frequency and the center frequency to produce a band frequency.

16. The method of claim 15, wherein the subband PLL filters out a quantization noise produced by the adjustable non-integer frequency divider to reduce an impact of the quantization noise on the main PLL.

17. The method of claim 15, wherein the mixer connects to an output end of the main PLL and an output end of the subband PLL, and mixes the channel frequency and the center frequency to produce the band frequency.

18. The method of claim 15, further comprising passing the band frequency through a multiplexer connected to the output end of the main PLL to maintain or frequency divide the band frequency.

19. The method of claim 18, further comprising, before passing the band frequency through the multiplexer, passing the band frequency through a halving circuit cascaded between the multiplexer and the output end of the main PLL.

* * * * *